United States Patent
Chen et al.

(10) Patent No.: US 12,224,675 B2
(45) Date of Patent: Feb. 11, 2025

(54) VOLTAGE DETECTION CIRCUIT, SWITCHING CONVERTER AND INTEGRATED CIRCUIT

(71) Applicant: Silergy Semiconductor Technology (Hangzhou) LTD, Hangzhou (CN)

(72) Inventors: Jiabin Chen, Hangzhou (CN); Hongxing Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 254 days.

(21) Appl. No.: 17/747,282

(22) Filed: May 18, 2022

(65) Prior Publication Data
US 2022/0407428 A1 Dec. 22, 2022

(30) Foreign Application Priority Data
Jun. 18, 2021 (CN) .......................... 202110677238.8

(51) Int. Cl.
 *H02M 3/335* (2006.01)
 *G01R 19/10* (2006.01)
 *H02M 3/156* (2006.01)

(52) U.S. Cl.
 CPC ........ *H02M 3/33592* (2013.01); *G01R 19/10* (2013.01); *H02M 3/156* (2013.01)

(58) Field of Classification Search
 CPC ............ H02M 3/22; H02M 1/08; H02M 1/36; H02M 3/24; H02M 3/325; H02M 3/335; H02M 3/28; H02M 3/01; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/33561; H02M 3/155; H02M 3/1582; H02M 1/4233; H02M 1/12; H02M 3/07; H02M 7/219; H02M 7/4815; H02M 1/0048; H02M 7/4818; H02M 7/4826; H02M 3/156; Y02B 70/1491; G01R 19/10
See application file for complete search history.

(56) References Cited

U.S. PATENT DOCUMENTS

| | | | |
|---|---|---|---|
| 6,075,716 A | 6/2000 | He et al. | |
| 6,249,444 B1 * | 6/2001 | Cross | H02M 3/33569 363/131 |
| 6,385,057 B1 | 5/2002 | Barron | |
| 8,471,488 B1 | 6/2013 | Hopkins et al. | |
| 9,077,260 B2 | 7/2015 | Zhao et al. | |

(Continued)

FOREIGN PATENT DOCUMENTS

| | | |
|---|---|---|
| CN | 108093534 A | 5/2008 |
| CN | 104297553 A | 1/2015 |

*Primary Examiner* — Jeffrey A Gblende

(57) ABSTRACT

A voltage detection circuit for a switching converter having a switch and a magnetic element connected in series, where a first terminal of the switch and a first terminal of the magnetic element are connected to a common node, the voltage detection circuit including: an average circuit configured to receive a first voltage across the switch, and to generate a second voltage representing an average value of the first voltage; and where the second voltage represents a voltage between a second terminal of the switch and a second terminal of the magnetic element in a steady state of the switching converter.

19 Claims, 7 Drawing Sheets

(56) References Cited

U.S. PATENT DOCUMENTS

| | | |
|---|---|---|
| 9,124,169 B2 | 9/2015 | Garlow et al. |
| 9,525,336 B2 | 12/2016 | Huang |
| 9,929,659 B2 * | 3/2018 | Foresta .................. H02M 1/08 |
| 10,454,369 B2 * | 10/2019 | Savic .................... H02M 3/156 |
| 2009/0243398 A1 | 10/2009 | Yohanan et al. |
| 2013/0082611 A1 * | 4/2013 | Cohen ................... H05B 45/44 |
| | | 323/283 |
| 2014/0152283 A1 * | 6/2014 | Kuang ............... H02M 3/33523 |
| | | 323/283 |
| 2015/0207398 A1 | 7/2015 | Proca |
| 2015/0216007 A1 | 7/2015 | Ferrara et al. |

\* cited by examiner

VOLTAGE DETECTION CIRCUIT, SWITCHING CONVERTER AND INTEGRATED CIRCUIT

RELATED APPLICATIONS

This application claims the benefit of Chinese Patent Application No. 202110677238.8, filed on Jun. 18, 2021, which is incorporated herein by reference in its entirety.

FIELD OF THE INVENTION

The present invention generally relates to the field of power electronics, and more particularly to voltage detection circuits, switching converters, and associated integrated circuits.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
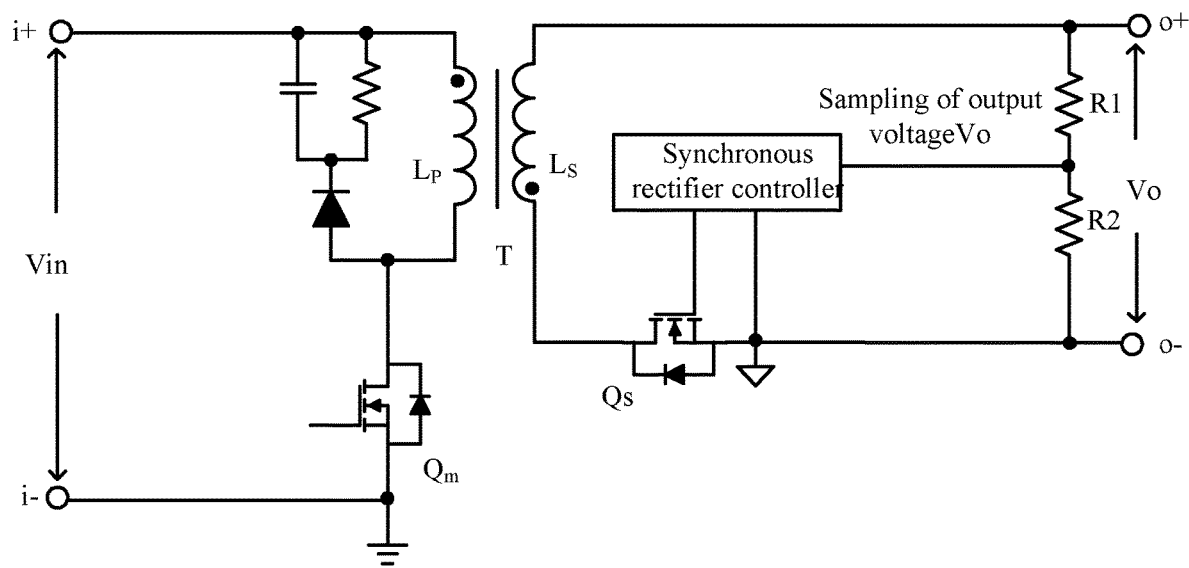
FIG. 1 is a schematic block diagram of an example voltage detection circuit of a switching converter.

Referring now to FIG. 1, shown is a schematic block diagram of an example voltage detection circuit of a switching converter. In this example, the switching converter is configured as a flyback converter, which includes a switch adopting a lower topology. The voltage detection circuit includes a resistor divider to sample an output voltage of the switching converter, and provides the sampled voltage to a synchronous rectifier controller of the switching converter, thereby controlling the operating state of the switch. When the switch adopts the upper topology (not shown in the figure); that is, the switch Qs is connected between winding Ls of the transformer and positive output terminal o+, the reference ground of the synchronous rectifier controller is not connected to the output reference ground. Therefore, the operating state of the switch may not be controlled according to the output voltage with the output reference ground as the voltage reference point.

In particular embodiments, a voltage detection circuit and a switching converter thereof are provided, can perform voltage sampling without adding extra pins or extra external circuits, and may also sample the voltage when the reference ground of the switch control circuit is floating. The switching converter can include a switch and a magnetic element connected in series, and one terminal of the switch and one terminal of the magnetic element being connected to a common node. The voltage detection circuit can include an average circuit configured to receive a first voltage across the switch, and may generate a second voltage representing an average value of the first voltage. The second voltage represents a voltage between the other terminal of the switch and the other terminal of the magnetic element in a steady state of the switching converter. For example, the average circuit is configured as a low-pass filter.

Figure 2:
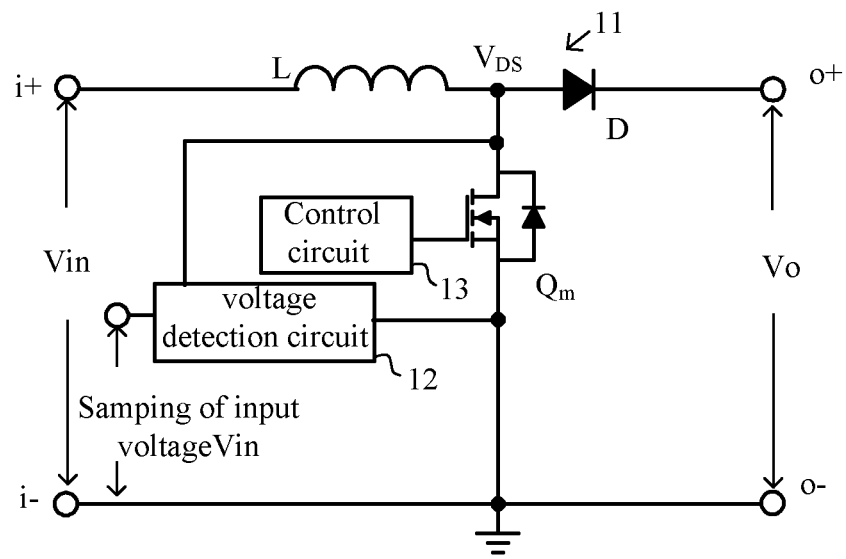
FIG. 2 is a schematic block diagram of a first example switching converter, in accordance with embodiments of the present invention.

Referring now to FIG. 2, shown is a schematic block diagram of a first example switching converter, in accordance with embodiments of the present invention. In this particular example, the switching converter is configured as a boost converter. Switching converter 1 can include power stage circuit 11, voltage detection circuit 12, and control circuit 13. Further, power stage circuit 11 can include a switch (e.g., main power transistor Qm) and inductor L connected in series. The first terminal of inductor L and the first terminal of main power transistor Qm can connect to a common node, the second terminal of inductor L can connect to positive input terminal i+, and the second terminal of main power transistor Qm can connect to negative input terminal i−. In addition, positive input terminal i+ and negative input terminal i− of switching converter 1 can receive input voltage Vin, and positive output terminal o+ and negative output terminal o− may generate output voltage Vo. Negative input terminal i− and negative output terminal o− of switching converter 1 can connect to the same reference ground.

In particular embodiments, optionally, main power transistor is a MOSFET, the first terminal of which is the drain, the second terminal of which is the source, and the gate of which is the control terminal. Voltage detection circuit 12 can connect between the first terminal and the second terminal of main power transistor Qm to detect the voltage across main power transistor Qm. In particular embodiments, voltage detection circuit 12 can include a low-pass filter, and the reference ground of the low-pass filter and the reference ground of control circuit 13 of switching converter 1 may both be connected to the second terminal of main power transistor Qm. That is, the reference ground of the low-pass filter and the reference ground of control circuit 13 can connect to negative input terminal i−. In particular embodiments, the low-pass filter has a time constant, and the output voltage of the low-pass filter is the average value of the received voltage. For example, the low-pass filter may receive voltage $V_{DS}$ across the main power transistor, and can generate voltage Va representing the average value of first voltage $V_{DS}$. Optionally, e.g., the low-pass filter is an RC filter. It should be understood that any other forms of low-pass filters can be utilized in certain embodiments. In this example, control circuit 13 can control the switching state of the main power transistor according to second voltage Va.

When the switching converter operates in a steady state, according to the principle of volt-second balance, it can be known: $\Delta Von*Ton=\Delta Voff*Toff$, where Ton is the conduction time of the main power transistor, Toff is the off time of the main power transistor, $\Delta Von$ is the voltage drop across inductor L when the main power transistor is turned on, and $\Delta Voff$ is the voltage drop across inductor L when the main power transistor is turned off. When the main power transistor is turned on, according to the KVL law: $V_{DS\_on}=Vin-\Delta Von$; when the main power transistor is turned off, according to the KVL law: $V_{DS\_off}=Vin+\Delta Voff$. Further, the voltage Va satisfies the following formula: $Va=(Ton*V_{DS\_on}+Toff*V_{DS\_off})/T$, where T is the switching period of the main power transistor.

According to the above relationship, it can be obtained that voltage Va is equal to input voltage Vin; that is, Va=Vin. Therefore, voltage Va represents a voltage between the other terminal of main power transistor Qm that is not connected to inductor L (e.g., the second terminal) and the other terminal of inductor L that is not connected to the main power transistor Qm (e.g., the second terminal) in the steady state; that is, input voltage of switching converter 1, thereby realizing sampling of the input voltage of the switching converter.

Figure 3:
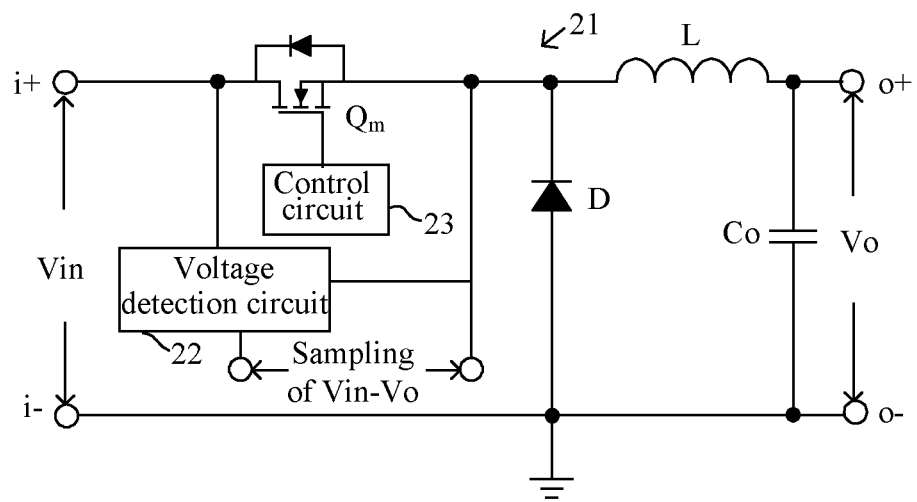
FIG. 3 is a schematic block diagram of a second example switching converter, in accordance with embodiments of the present invention.

Referring now to FIG. 3, shown is a schematic block diagram of a second example switching converter, in accordance with embodiments of the present invention. In this particular example, the switching converter is configured as a buck converter that includes a switch adopting an upper topology. Switching converter 2 can include power stage circuit 21, voltage detection circuit 22, and control circuit 23. Power stage circuit 21 can include a switch (e.g., main power transistor Qm) and inductor L connected in series. The first terminal of inductor L and the second terminal of main power transistor Qm can connect to a common node, the second terminal of inductor L can connect to positive output terminal o+, and the first terminal of main power transistor Qm can connect to positive input terminal i+. In addition, positive input terminal i+ and negative input terminal i− of switching converter 2 may receive input voltage Vin, and positive output terminal o+ and negative output terminal o− can generate output voltage Vo. Here, negative input terminal i− and negative output terminal o− of switching converter 2 can connect to the same reference ground. For example, the main power transistor is a MOSFET, the first terminal of which is the drain, the second terminal of which is the source, and the gate of which is the control terminal. Voltage detection circuit 12 can connect between the first terminal and the second terminal of main power transistor Qm to detect the voltage across main power transistor Qm.

In particular embodiments, voltage detection circuit 22 can include a low-pass filter, and the reference ground of the low-pass filter and the reference ground of the control circuit may both be connected to the second terminal of main power transistor Qm. The low-pass filter has a time constant, and the output voltage of the low-pass filter is the average value of the received voltage. For example, the low-pass filter can receive first voltage Vis across main power transistor Qm, and may generate voltage Va representing the average value of voltage $V_{DS}$. For example, control circuit 23 can control the switching state of the main power transistor according to voltage Va. Optionally, the low-pass filter is an RC filter. When the switching converter is in a steady state, based on the derivation process similar to that of the first embodiment, it can be known that voltage Va represents the difference between input voltage Vin and output voltage Vo of switching converter 2 in a steady state; that is, Va=Vin−Vo. Therefore, voltage Va represents the voltage between the first terminal of main power transistor Qm and the second terminal of inductor L in the steady state; that is, the difference between input voltage Vin and output voltage Vo of switching converter 2, thereby achieving the sampling of the difference between the input voltage and the output voltage of the switching converter.

Figure 4:
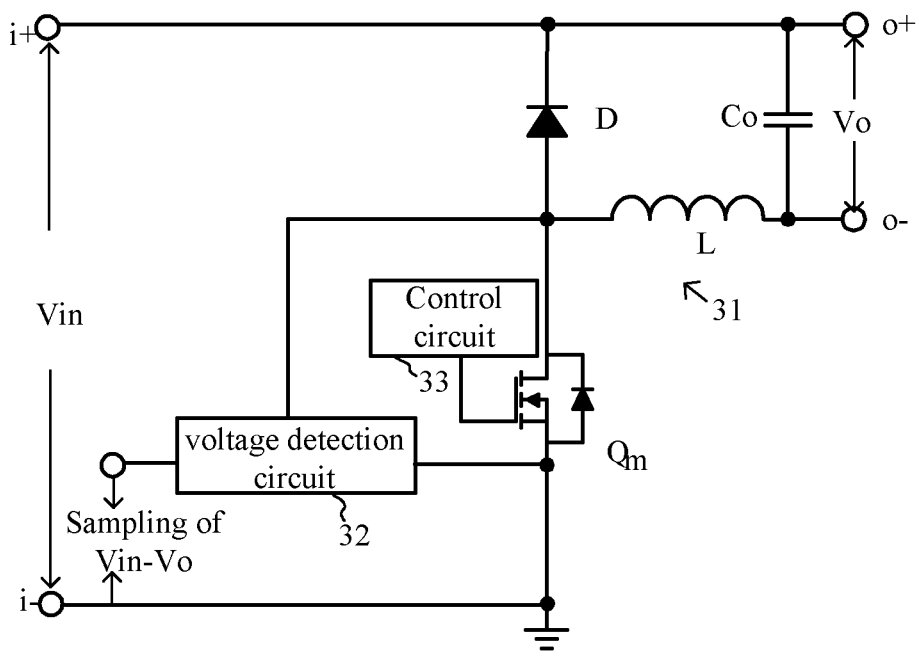
FIG. 4 is a schematic block diagram of a third example switching converter, in accordance with embodiments of the present invention.

Referring now to FIG. 4, shown is a schematic block diagram of a third example switching converter, in accordance with embodiments of the present invention. In this particular example, the switching converter is configured as a buck converter which includes a switch adopting a lower topology. Switching converter 3 can include power stage circuit 31, voltage detection circuit 32, and control circuit 33. Power stage circuit 31 can include a switch (e.g., main power transistor Qm) and inductor L connected in series. The first terminal of inductor L and the first terminal of main power transistor Qm can connect to a common node, the second terminal of inductor L can connect to positive output terminal o+, and the second terminal of main power transistor Qm can connect to negative input terminal i−. In addition, positive input terminal i+ and negative input terminal i− of switching converter 2 may receive input voltage Vin, and positive output terminal o+ and negative output terminal o− can generate output voltage Vo. Here, negative input terminal i− and negative output terminal o− of switching converter 2 are connected to different reference grounds. For example, the main power transistor is a MOSFET, the first terminal of which is the drain, the second terminal of which is the source, and the gate of which is the control terminal. Voltage detection circuit 12 can connect between the first terminal and the second terminal of main power transistor Qm to detect the voltage across main power transistor Qm.

In particular embodiments, voltage detection circuit 32 can include a low-pass filter, and the reference ground of the low-pass filter and the reference ground of the control circuit are both connected to the second terminal of main power transistor Qm. The low-pass filter has a time constant, and the output voltage of the low-pass filter is the average value of the received voltage. For example, the low-pass filter may receive voltage $V_{DS}$ across main power transistor Qm, and generate voltage Va representing the average value of first voltage $V_{DS}$. For example, control circuit 23 can control the switching state of the main power transistor according to voltage Va. Optionally, the low-pass filter is an RC filter. When the switching converter is in a steady state, based on the derivation process similar to that of the first embodiment, it can be known that voltage Va represents the difference between input voltage Vin and output voltage Vo of switching converter 2 in a steady state; that is, Va=Vin−Vo. Therefore, voltage Va represents the voltage between the second terminal of main power transistor Qm and the second terminal of inductor L in the steady state; that is, the difference between input voltage Vin and output voltage Vo of switching converter 2, thereby achieving the sampling of the difference between the input voltage and the output voltage of the switching converter.

Figure 5:
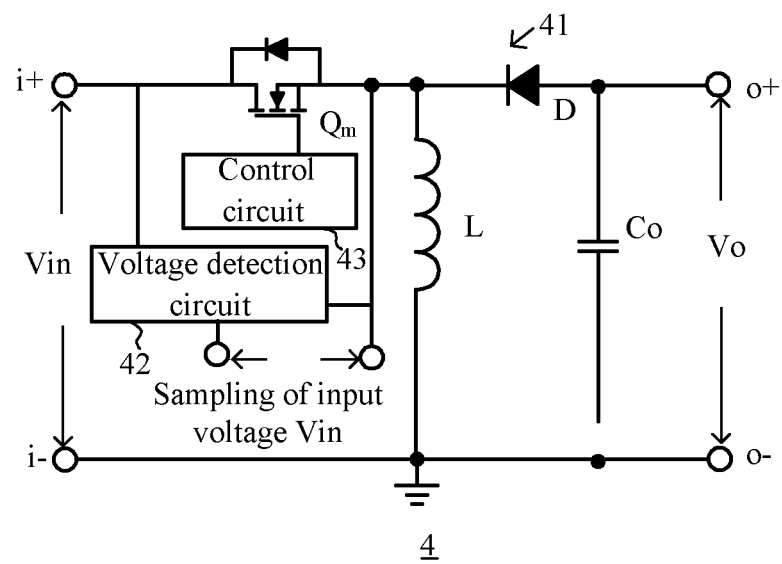
FIG. 5 is a schematic block diagram of a fourth example switching converter, in accordance with embodiments of the present invention.

Referring now to FIG. 5, shown is a schematic block diagram of a fourth example switching converter, in accordance with embodiments of the present invention. In this particular example, the switching converter is configured as a Buck-Boost converter. Switching converter 4 can include power stage circuit 41, voltage detection circuit 42, and control circuit 43. Power stage circuit 41 can include a switch (e.g., main power transistor Qm) and inductor L connected in series. The first terminal of inductor L and the second terminal of main power transistor Qm can connect to a common node, the second terminal of inductor L can connect to negative output terminal o−, and the first terminal of main power transistor Qm is connected to positive input terminal i+. In addition, positive input terminal i+ and negative input terminal i− of switching converter 4 can receive input voltage Vin, and positive output terminal o+ and negative output terminal o− may generate output voltage Vo. Here, negative input terminal i− and negative output terminal o− of switching converter 4 can connect to the same reference ground. For example, the main power transistor is a MOSFET, the first terminal of which is the drain, the second terminal of which is the source, and the gate of which is the control terminal. Voltage detection circuit 42 can connect between the first terminal and the second terminal of main power transistor Qm to detect the voltage across main power transistor Qm.

In particular embodiments, voltage detection circuit 42 can include a low-pass filter, and the reference ground of the low-pass filter and the reference ground of the control circuit are both connected to the second terminal of main power transistor Qm. The low-pass filter has a time constant, and the output voltage of the low-pass filter is the average value of the received voltage. For example, the low-pass filter may receive voltage $V_{DS}$ across main power transistor Qm, and can generate voltage Va representing the average value of first voltage $V_{DS}$. For example, control circuit 43 can control the switching state of the main power transistor according to voltage Va. Optionally, the low-pass filter is an RC filter. When the switching converter is in a steady state, based on the derivation process similar to that of the first embodiment, it can be known that voltage Va represents input voltage Vin of switching converter 2 in a steady state; that is, Va=Vin. Therefore, voltage Va represents the voltage between the first terminal of main power transistor Qm and the second terminal of inductor L in the steady state; that is, input voltage Vin of switching converter 4, thereby achieving the sampling of the input voltage of the switching converter.

Figure 6:
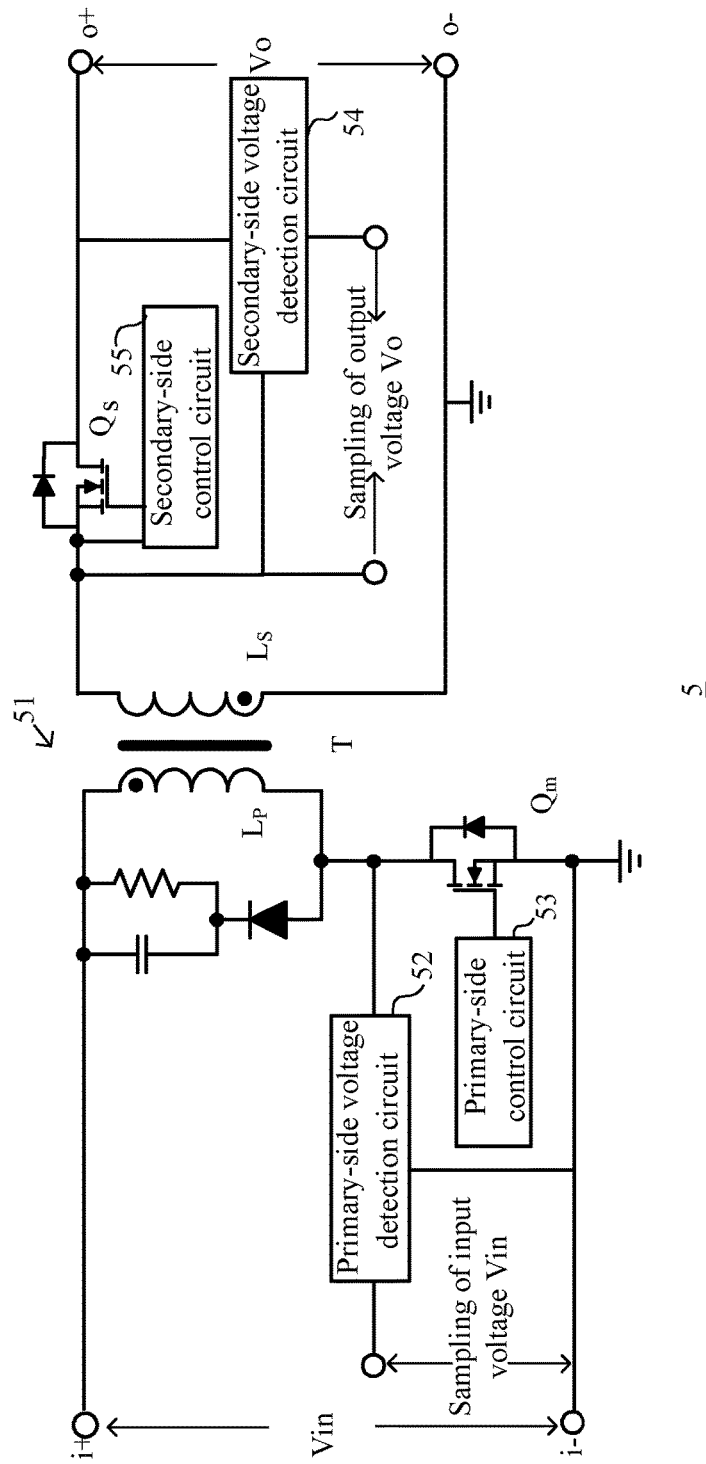
FIG. 6 is a schematic block diagram of a fifth example switching converter, in accordance with embodiments of the present invention.

Referring now to FIG. 6, shown is a schematic block diagram of a fifth example switching converter, in accordance with embodiments of the present invention. In this particular example, the switching converter is configured as a Flyback converter. Switching converter 5 can include power stage circuit 51. Power stage circuit 51 can include transformer T (including primary winding $L_P$ and a secondary winding $L_S$), main power transistor Qm, and rectifier transistor Qs. Main power transistor Qm can connect in series with primary winding $L_P$. The second terminal of primary winding $L_P$ (e.g., the non-dotted terminal) and the first terminal of main power transistor Qm can connect to a common node, the first terminal of the primary winding (e.g., the dotted terminal) can connect to positive input terminal i+, and the second terminal of main power transistor Qm can connect to negative input terminal i−. Rectifier transistor Qs can connect in series with secondary winding $L_S$, the first terminal of secondary winding $L_S$ (e.g., the non-dotted terminal) and the second terminal of rectifier transistor Qs can connect to the common node, the second terminal of secondary winding $L_S$ (e.g., the dotted terminal) can connect to negative output terminal o−, and the first terminal of rectifier transistor Qs can connect to positive output terminal o. In addition, positive input terminal i+ and negative input terminal i− of switching converter 5 can receive input voltage Vin, and positive output terminal o+ and negative output terminal o− may generate output voltage Vo.

Here, negative input terminal i− and negative output terminal o− of switching converter 5 can connect to different reference grounds. For example, the main power transistor and the rectifier transistor are MOSFETs, the first terminal of which is the drain, the second terminal of which is the source, and the gate of which is the control terminal. This Flyback converter can also include primary-side voltage detection circuit 52 and primary-side control circuit 53. Primary-side voltage detection circuit 52 can include a low-pass filter, and the reference ground of the low-pass filter and the reference ground of the primary-side control circuit of the switching converter may both be connected to the second terminal of main power transistor Qm. That is, the reference ground of the low-pass filter and the reference ground of primary-side control circuit 53 can connect to negative input terminal i−.

The low-pass filter has a time constant, and the output voltage of the low-pass filter is the average value of the received voltage. For example, the low-pass filter may receive voltage $V_{DS}$ across main power transistor Qm, and can generate voltage Va1 representing the average value of voltage $V_{DS}$. For example, the low-pass filter is an RC filter, and primary-side control circuit 53 can control the switching state of the main power transistor according to voltage Va1. When the switching converter is in a steady state, based on the derivation process similar to that of the first example, it can be known that voltage Va1 represents input voltage Vin of switching converter 5 in a steady state; that is, Va1=Vin. Therefore, voltage Va1 represents the voltage between the second terminal of main power transistor Qm and the first terminal of primary winding $L_P$ in the steady state; that is, input voltage Vin of switching converter 5, thereby achieving the sampling of the input voltage of the switching converter.

In this example, the Flyback converter can also include secondary-side voltage detection circuit 54 and secondary-side control circuit 55. Secondary-side voltage detection circuit 54 can include a low-pass filter, and the reference ground of the low-pass filter and the second terminal of rectifier transistor Qs may both be connected to the reference ground of the secondary-side control circuit of the switching converter. The low-pass filter has a time constant, and the output voltage of the low-pass filter is the average value of the received voltage. For example, the low-pass filter can receive voltage $V_{DS2}$ across rectifier transistor Qs, and can generate voltage Va2 representing the average value of first voltage $V_{DS2}$. Optionally, the low-pass filter is an RC filter. For example, secondary-side control circuit 55 can control the switching state of rectifier transistor Qs according to voltage Va2. When the switching converter is in a steady state, based on the derivation process similar to the first example, it can be known that voltage Va2 represents output voltage Vo of switching converter 5 in a steady state; that is, Va2=Vo. Therefore, voltage Va2 represents the voltage between the second terminal of rectifier transistor Qs and the second terminal of secondary winding Ls in the steady state; that is, output voltage Vo of switching converter 5, thereby realizing the sampling of the output voltage of the switching converter.

Figure 7:
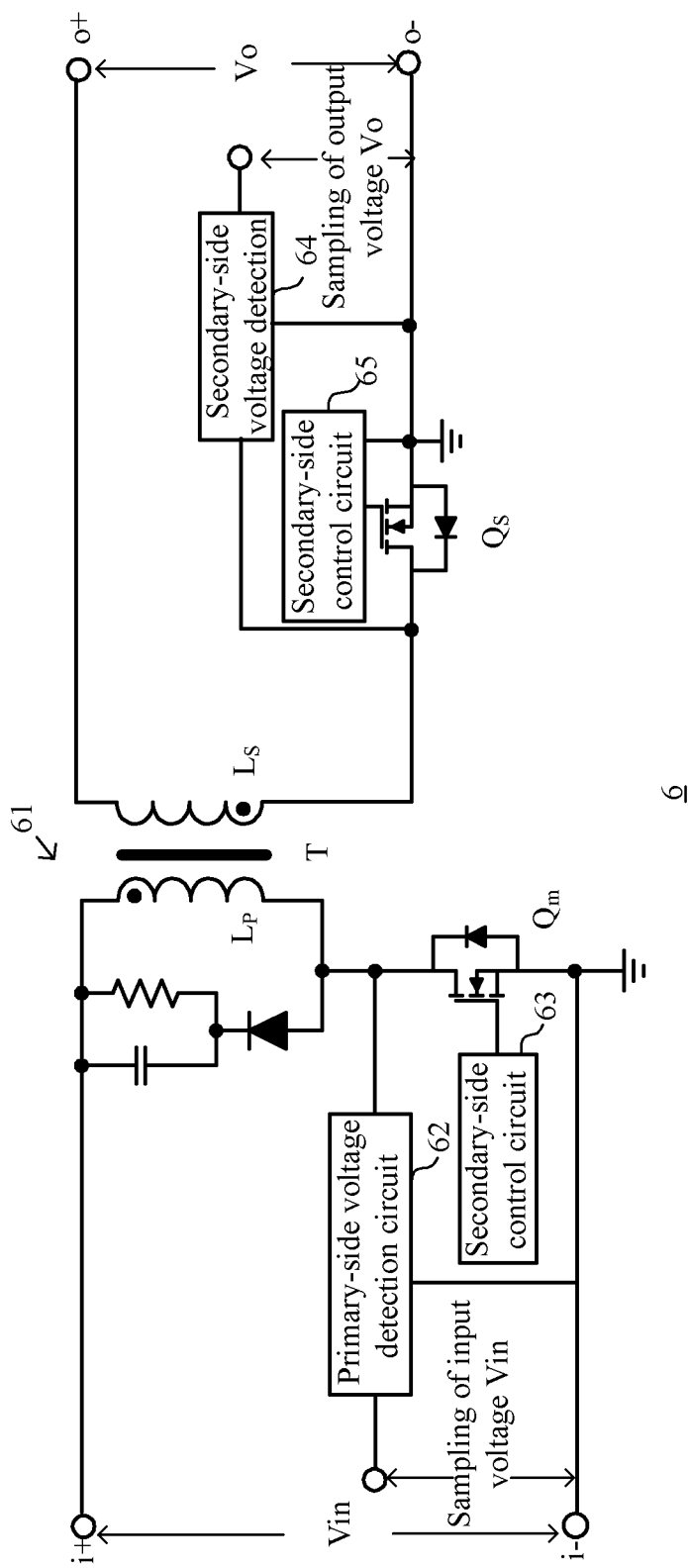
FIG. 7 is a schematic block diagram of a sixth example switching converter, in accordance with embodiments of the present invention.

Referring now to FIG. 7, shown is a schematic block diagram of a sixth example switching converter, in accordance with embodiments of the present invention. In this particular example, the second terminal of the secondary winding (e.g., the dotted terminal) and the first terminal of the rectifier transistor are connected to the common node, the first terminal of the secondary winding is connected to positive output terminal o+, and the second terminal of the rectifier transistor is connected to negative output terminal o−. In this example, the Flyback converter can also include secondary-side voltage detection circuit 64 and secondary-side control circuit 65. Secondary-side voltage detection circuit 64 can include a low-pass filter, and the reference ground of the low-pass filter and the second terminal of rectifier transistor Qs may both be connected to the reference ground of the secondary-side control circuit of the switching converter. Here, the reference ground of the secondary-side control circuit of is the same as the reference ground of negative output terminal o−.

The low-pass filter has a time constant, and the output voltage of the low-pass filter is the average value of the received voltage. For example, the low-pass filter can receive voltage $V_{DS}$ across rectifier transistor Qs, and may generate voltage Va representing the average value of voltage $V_{DS}$. In the example, secondary-side control circuit 65 can control the switching state of rectifier transistor Qs according to voltage Va. When the switching converter is in a steady state, based on the derivation process similar to the first example, it can be known that voltage Va represents output voltage Vo of switching converter 6 in a steady state; that is, Va=Vo. Therefore, voltage Va represents the voltage between the second terminal of rectifier transistor Qs and the second terminal of secondary winding Ls in the steady state; that is, output voltage Vo of switching converter 6, thereby realizing the sampling of the output voltage of the switching converter.

In particular embodiments, a voltage detection circuit, a switching converter, and an integrated circuit are provided. The switching converter can include a switch and a magnetic element connected in series, and one terminal of the switch and one terminal of the magnetic element are jointly connected to a common node. The voltage detection circuit can include a low-pass filter for receiving a first voltage across the switch and outputting a second voltage representing an average value of the first voltage, where the second voltage is used for characterizing the voltage between the other terminal of the switch and the other terminal of the magnetic element in the steady state of the switching converter. According to the voltage detection circuit of certain embodiments and the switching converter thereof, the average value representing the voltage at both terminals of the switch is obtained through a low-pass filter to realize voltage sampling, without adding extra pins or extra external circuits. In addition, the voltage sampling can be performed when the reference ground of the switch control circuit is floating. Further, the sampled voltage can be used as a control signal to control corresponding switch in the switching converter when required in order to realize different control functions.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A voltage detection circuit for a switching converter having a switch and a magnetic element connected in series, wherein a first terminal of the switch and a first terminal of the magnetic element are connected to a common node, the voltage detection circuit comprising:
    a) a low-pass filter configured to receive a first voltage across the switch, and to generate a second voltage representing an average value of the first voltage;
    b) wherein the second voltage represents a voltage between a second terminal of the switch and a second terminal of the magnetic element in a steady state of the switching converter; and
    c) wherein the switching converter is configured as a Boost converter, the switch is connected between the common node and a negative input terminal of the switching converter, the magnetic element is connected to a positive input terminal of the switching converter and the common node, and the second voltage represents an input voltage of the switching converter.

2. The voltage detection circuit of claim 1, wherein the second voltage represents one of: an input voltage of the switching converter, an output voltage of the switching converter, and a difference between the input voltage and the output voltage.

3. The voltage detection circuit of claim 1, wherein a reference ground of the low-pass filter and a reference ground of a control circuit of the switching converter are both connected to the second terminal of the switch.

4. The voltage detection circuit of claim 1, wherein the magnetic element comprises an inductor or a winding of a transformer.

5. The voltage detection circuit of claim 1, further comprising a control circuit configured to control a switching state of the switch according to the second voltage output by the voltage detection circuit.

6. An integrated circuit, comprising the voltage detection circuit of claim 1, and the switch of the switching converter.

7. A voltage detection circuit for a switching converter having a switch and a magnetic element connected in series, wherein a first terminal of the switch and a first terminal of the magnetic element are connected to a common node, the voltage detection circuit comprising:
    a) a low-pass filter configured to receive a first voltage across the switch, and to generate a second voltage representing an average value of the first voltage;
    b) wherein the second voltage represents a voltage between a second terminal of the switch and a second terminal of the magnetic element in a steady state of the switching converter; and
    c) wherein the switching converter is configured as a Buck converter, the switch is connected between the common node and a positive input terminal of the switching converter, the magnetic element is connected to a positive output terminal of the switching converter and the common node, and the second voltage represents a difference between an input voltage and an output voltage of the switching converter.

8. The voltage detection circuit of claim 7, wherein the second voltage represents one of: an input voltage of the switching converter, an output voltage of the switching converter, and a difference between the input voltage and the output voltage.

9. The voltage detection circuit of claim 7, wherein a reference ground of the average circuit and a reference ground of a control circuit of the switching converter are both connected to the second terminal of the switch.

10. The voltage detection circuit of claim 7, wherein the magnetic element comprises an inductor or a winding of a transformer.

11. A voltage detection circuit for a switching converter having a switch and a magnetic element connected in series, wherein a first terminal of the switch and a first terminal of the magnetic element are connected to a common node, the voltage detection circuit comprising:
   a) a low-pass filter configured to receive a first voltage across the switch, and to generate a second voltage representing an average value of the first voltage;
   b) wherein the second voltage represents a voltage between a second terminal of the switch and a second terminal of the magnetic element in a steady state of the switching converter; and
   c) wherein the switching converter is configured as a Buck converter, the switch is connected between the common node and a negative input terminal of the switching converter, the magnetic element is connected to a negative output terminal of the switching converter and the common node, and the second voltage represents a difference between an input voltage and an output voltage of the switching converter.

12. A voltage detection circuit for a switching converter having a switch and a magnetic element connected in series, wherein a first terminal of the switch and a first terminal of the magnetic element are connected to a common node, the voltage detection circuit comprising:
   a) a low-pass filter configured to receive a first voltage across the switch, and to generate a second voltage representing an average value of the first voltage;
   b) wherein the second voltage represents a voltage between a second terminal of the switch and a second terminal of the magnetic element in a steady state of the switching converter; and
   c) wherein the switching converter is configured as a Buck-Boost converter, the switch is connected between the common node and a positive input terminal of the switching converter, the magnetic element is connected to a negative output terminal of the switching converter and the common node, and the second voltage represents an input voltage of the switching converter.

13. A voltage detection circuit for a switching converter having a switch and a magnetic element connected in series, wherein a first terminal of the switch and a first terminal of the magnetic element are connected to a common node, the voltage detection circuit comprising:
   a) a low-pass filter configured to receive a first voltage across the switch, and to generate a second voltage representing an average value of the first voltage;
   b) wherein the second voltage represents a voltage between a second terminal of the switch and a second terminal of the magnetic element in a steady state of the switching converter;
   c) wherein the switching converter is configured as a Flyback converter;
   d) wherein when the low-pass filter is used to detect a voltage across the switch at a primary side, the second voltage is used to represent an input voltage of the switching converter, and
   e) wherein when the low-pass filter is used to detect a voltage across the switch at a secondary side, the second voltage is used to represent an output voltage of the switching converter.

14. The voltage detection circuit of claim 13, wherein the magnetic element is a primary winding connected between a positive input terminal of the switching converter and the common node, and the switch at the primary side is connected between the common node and the negative input terminal of the switching converter.

15. The voltage detection circuit of claim 13, wherein the magnetic element is a secondary winding connected between the common node and a negative terminal of the switching converter, and the switch at secondary side is connected between the common node and the positive output terminal of the switching converter.

16. The voltage detection circuit of claim 13, wherein the magnetic element is a secondary winding connected between the common node and a positive output terminal of the switching converter, and the switch at the secondary side is connected between the common node and the negative output terminal of the switching converter.

17. The voltage detection circuit of claim 13, wherein the second voltage represents one of: an input voltage of the switching converter, an output voltage of the switching converter, and a difference between the input voltage and the output voltage.

18. The voltage detection circuit of claim 13, wherein a reference ground of the average circuit and a reference ground of a control circuit of the switching converter are both connected to the second terminal of the switch.

19. The voltage detection circuit of claim 13, wherein the magnetic element comprises an inductor or a winding of a transformer.

* * * * *